United States Patent [19]

Pillow

[11] Patent Number: 5,134,361
[45] Date of Patent: Jul. 28, 1992

[54] OPITCAL SYSTEM FOR LINEARIZING NON-LINEAR ELECTRO-OPTIC

[75] Inventor: J. Keith Pillow, Fredericksburg, Va.

[73] Assignee: The United States of America as represented by the Secretary of the Navy, Washington, D.C.

[21] Appl. No.: 657,015

[22] Filed: Feb. 19, 1991

[51] Int. Cl.⁵ .................. G01R 31/00; G01R 23/16
[52] U.S. Cl. .................. 324/96; 324/77 K; 324/117 R; 250/231.1; 359/247
[58] Field of Search ............. 324/117 R, 96, 158 R, 324/158 D, 77 K, 244.1; 356/398, 400, 368; 359/364, 315, 316–320, 183, 287, 249, 247, 257; 250/231.1, 225; 360/114

[56] References Cited

U.S. PATENT DOCUMENTS

| | | | |
|---|---|---|---|
| 3,465,322 | 9/1969 | Stapper | 360/114 |
| 3,586,416 | 6/1971 | DeBitetto | 359/315 |
| 4,124,273 | 11/1978 | Huignard et al. | 359/319 |
| 4,221,463 | 9/1980 | Barsack et al. | 359/249 |
| 4,700,150 | 10/1987 | Hall et al. | 359/287 |
| 4,769,853 | 9/1988 | Goodwin et al. | 359/183 |
| 4,843,232 | 6/1989 | Emo et al. | 324/260 |
| 4,962,353 | 10/1990 | Takaharhi et al. | 324/96 |
| 4,968,881 | 11/1990 | Takaharhi et al. | 324/96 |
| 4,983,911 | 1/1991 | Henley | 324/96 |
| 5,028,865 | 7/1991 | Meyrueix et al. | 324/96 |
| 5,041,779 | 8/1991 | Haler | 324/96 |

*Primary Examiner*—Vinh Nguyen
*Attorney, Agent, or Firm*—John D. Lewis; Kenneth E. Walden

[57] ABSTRACT

A device for rapidly measuring voltages by electro-optic or magneto-optic means which exhibits a substantially linear response over much of its operating range. The device employs the Pockels effect in which the orientation of polarized light is altered in direct response to applied voltages. The response of the subject device is made substantially more linear by dividing the polarized light into two beams and retarding the phase of the second beam by one-quarter wavelength, attenuating its intensity by a factor of approximately four, and passing it through a second Pockels cell having a transducer constant of one half that of the first Pockels cell and then recombining, or superpositioning, the first and second beams of light, thus yielding a substantially linear response over much of the applied voltage range.

3 Claims, 1 Drawing Sheet

OPITCAL SYSTEM FOR LINEARIZING NON-LINEAR ELECTRO-OPTIC

ORIGIN OF THE INVENTION

The invention described herein was made in the performance of official duties by an employee of the Department of the Navy and may be manufactured, used and licensed by or for the Government of the United States of America for governmental purposes without payment of any royalties thereon or therefor.

BACKGROUND OF THE INVENTION

In many scientific applications it is desirable to quickly and accurately measure fluctuating electrical or magnetic stimuli, such as voltage, current, electrical field or magnetic field. It is often necessary to accomplish these measurements at widely varying frequencies. Heretofore, one of the best methods of achieving quick, accurate measurements of electric and/or magnetic stimuli over a wide bandwidth is to utilize one of several types of transducers which employ electro-optic or magneto-optic effects to modulate the intensity of a beam of light in proportion to the measured electrical or magnetic stimulus. Typically the electro-optic or magneto-optic transducer would be placed between crossed polarizers and a beam of light then transmitted through the optical components, including the transducer, to a detector. The application of the electrical or magnetic stimulus to be measured to the transducer induces a realignment of the light waves incident on the second polarizer and thus a change of light intensity of the light beam passing through the entire system. Since the intensity of the light is proportional to the applied electrical or magnetic stimulus, the stimulus is thus effectively measured. Unfortunately, such electro-optic or magneto-optic transducers have a largely non-linear response, and thus it is difficult to tell in an environment subject to rapidly fluctuating stimuli exactly which level of stimulus is being measured. Typically, existing electro-optic and magneto-optic systems are linear in their response over the very small range of plus or minus onesixth of the transducer constant.

Accordingly, it often is necessary to employ computers with existing systems in order to better predict which level of stimulus is being measured at a particular time; that is to say, where on the response curve the system is operating. Unfortunately, the insertion of a computer in the system operates to limit the bandwidth and accuracy of the system to the bandwidth and accuracy of the computer, and further adds to the cost and complexity of the system.

If the linear operating range of the electro-optic or magneto-optic transducers could be extended, then applied electrical or magnetic stimuli could be measured directly without the use of a costly computer system, with no loss of bandwidth or accuracy and at greatly reduced cost. There would also be no loss of speed of measurement on account of the necessity of employing additional equipment in the system, and the system could be built more cheaply.

SUMMARY OF THE INVENTION

Accordingly, one object of the present invention is to rapidly and accurately measure changes in electrical or magnetic stimuli.

Another object of the present invention is to measure electrical or magnetic stimuli over a wide range of frequencies.

Yet another object of the present invention is to rapidly and accurately measure electrical and magnetic stimuli over a wide range directly, and without the use of supplemental equipment such as computer systems which limit the accuracy and bandwidth of the system and add to its cost.

Yet still another object of the present invention is to extend the linear range of operation of electro-optic and magneto-optic transducers in a system to measure electrical and magnetic stimuli so as to enable the direct measurement of such stimuli over a wide range and without additional limitation on the bandwidth other than that imposed by the transducer itself.

According to one embodiment of the present invention, the foregoing and other objects are obtained by providing a laser light source directed into a polarizer. After exiting the polarizer, the light beam is split into equal parts. The primary beam is directed into a Pockels cell transducer which is electrically or magnetically attached to the stimulus to be measured. On exiting the primary beam Pockels cell, the light beam then passes through a second polarizer oriented at ninety degrees with respect to the first polarizer and then the first beam is recombined with the second beam and the combined beam is directed to an intensity measuring detector. The secondary beam is directed to a mirror and thence to a one-quarter wave plate which shifts its phase by one-quarter wavelength and thence passes to a neutral density filter to attenuate the second beam intensity by a factor of one-fourth.

After exiting the neutral density filter, the second beam then passes into a secondary Pockels cell which is also electrically or magnetically connected to the stimulus to be measured and which has a transducer constant of one-half of that of the first beam Pockels cell. Upon exiting the second beam Pockels cell the light beam is then passed through a second beam polarizer which is also oriented at ninety degrees with respect to the said first polarizer.

Thence the beam is directed via a mirror to the recombining device to be combined with the first beam and passed to the light intensity measuring detector. By superimposing the phase-shifted and attenuated second beam output of the second Pockels cell on the first beam output, a greatly increased linear range of operation is achieved on the order of 0 to 1.05 times the first Pockels cell transducer constant.

Various other objects and advantages of this invention will appear from the following detailed description of the preferred embodiment thereof when considered in connection with the accompanying drawings.

DESCRIPTION OF THE PREFERRED EMBODIMENT

Figure 1:
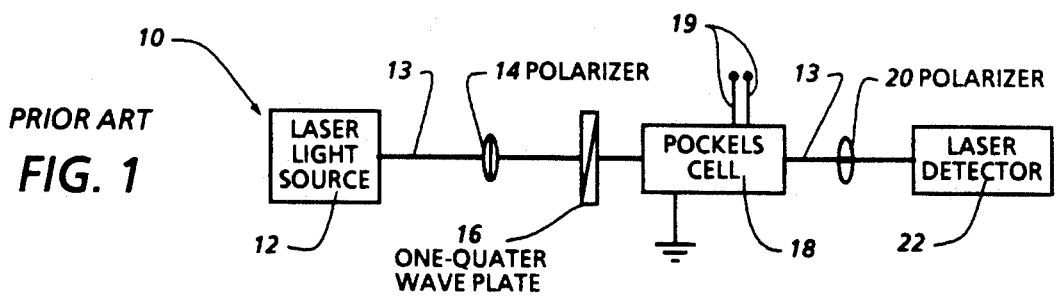
FIG. 1 is a schematic view of a prior art system for measuring voltage with a Pockels cell.
Figure 2:
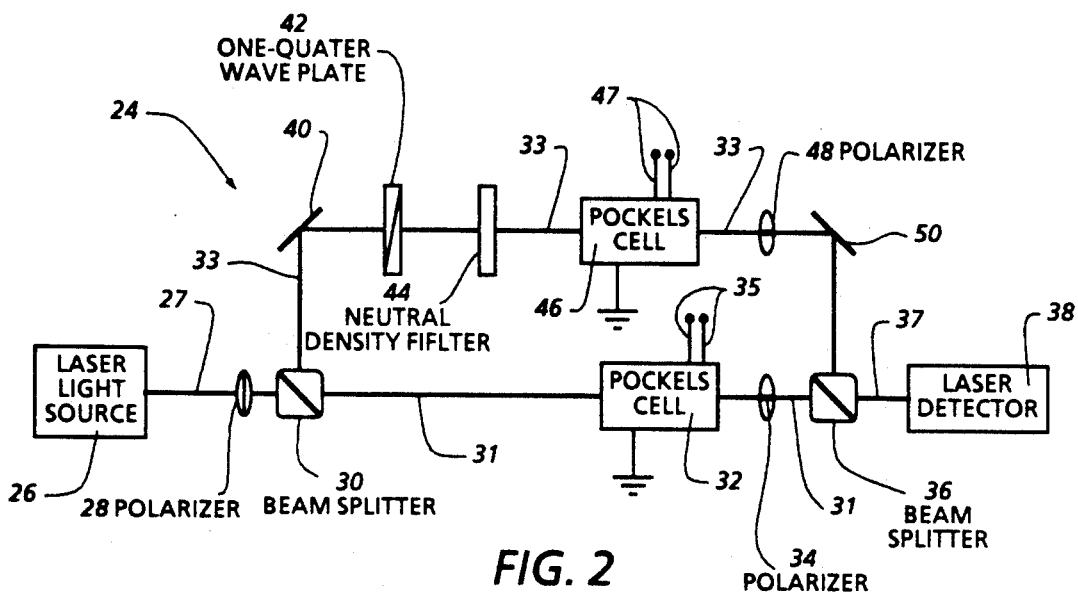
FIG. 2 is a schematic view of an optical device for measuring voltage according to the present invention.
Figure 3:
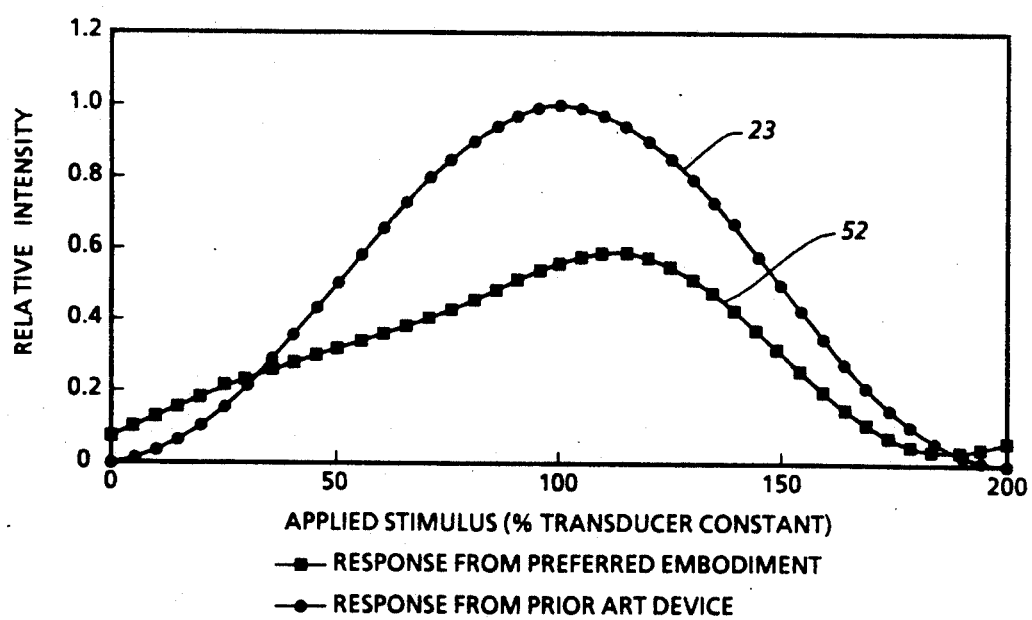
FIG. 3 is a graphic representation of the response curve of light output intensity relative to applied voltage of both the prior art device and a device constructed according to the present invention.

Referring now to the drawings wherein like referenced characters designated identical or corresponding parts, and more particularly to FIGS. 1, 2 and 3, a prior art device for optically measuring electrical or magnetic stimuli such as voltage, current or electrical or magnetic fields, designated generally by the reference numeral 10, is comprised basically of a laser light source 12 whose output beam 13 is directed into a polarizer 14 and thence through a one-quarter wave plate 16 whose function is to shift the phase of the laser light by one-quarter wavelength. After passing through one-quarter wave plate 16, the phase-shifted light is directed into a Pockels cell 18 which is electrically or magnetically connected to the electrical or magnetic stimulus to be measured via input terminals 19. In the described embodiment voltage is to be measured. When voltage, or other stimulus, is applied to the Pockels cell the orientation of the polarized laser light will be altered in proportion to the level of stimulus applied. The laser light beam 13 is next passed through a, second polarizer 20 which is optically aligned ninety degrees with respect to aforesaid first polarizer 14. Thus, if no stimulus was applied to Pockels cell 18, the laser beam 13 would be entirely attenuated after passing through polarizer 14 and polarizer 20. This situation would occur if there were no voltage or other stimulus applied to Pockels cell 14 to alter the orientation of the laser light passing through Pockels cell 14. Upon leaving polarizer 20 the laser beam 13 is directed to a laser detector 22 which measures the relative light intensity of the laser beam exiting polarizer 20. The intensity of light impinging upon detector 22 is proportional to the electrical stimulus to be measured. This is best expressed in the following formula:

$$\frac{I}{I_o} = \sin^2\left(\frac{\pi}{2} \frac{S}{S\lambda/2} + \theta\right)$$

I = the intensity at the detector.
$I_o$ = the input itensity.
S = the applied stimulus
$S\lambda/2$ = the transducer constant of the Pockels cell (a design parameter dependent upon the dimensions and material properties of the crystal in the cell).
$\theta$ = the phase shift caused by the quarter wave plate.

The relationship between output intensity and applied stimulus is as shown in FIG. 3 as curve 23. Thus it may be seen that the relationship between output intensity and applied stimulus is decidedly nonlinear over much of its range. Careful analysis reveals that the linear portion of prior art devices is typically constrained to plus or minus 0.167 of S, provided that a proper value for phase shift $\theta$ is selected.

In a device constructed according to the present invention, the linear range of light intensity response I in proportion to applied stimulus S may be extended to a range from 0 to 1.05 S. This is accomplished by providing a device as shown generally in FIG. 2 by reference numeral 24.

This device is comprised of a laser light source 26 whose output beam 27 is directed into a polarizer 28. Once the beam passes through polarizer 28 it is directed into a beam splitter 30 which divides the laser light beam into a primary beam 31 and a secondary beam 33 which are approximately equal in intensity. The primary beam output of beam splitter 30 is directed into Pockels cell 32 which is connected to the stimulus to be measured via input terminals 35. In the illustrated case, voltage is to be measured. As in the prior art device, Pockels cell 32 alters the alignment of the light passing through it in proportion to the level of stimulus to be measured which is applied to input terminals 35. The light beam leaving Pockels cell 32 is then directed into polarizer 34 which is optically aligned ninety degrees with respect to polarizer 28. Primary beam 31 leaving polarizer 34 is then directed into beam splitter 36 which is "oriented" so as to recombine the primary beam 31 and secondary beam 33 into a single beam 37. The output of beam splitter 36 is optically aligned with light intensity detector 38 in order to measure the relative light intensity of the recombined first and second beams (beam 37).

The secondary beam output 33 of beam splitter 30 is directed to mirror 40 which redirects the secondary beam through a one-quarter wave plate 42. One-quarter wave plate 42 operates to shift the phase of secondary beam 33 by one-quarter wavelength. The second beam output of quarter wave plate 42 then passes through a neutral density filter 44 which attenuates the intensity of the secondary beam 33 to one-quarter of its former strength. The secondary beam output of neutral filter 44 then passes to secondary Pockels cell 46 which is also connected to the stimulus to be measured via input terminals 47, in the illustrated case voltage. It should be noted that Pockels cell 46 has a transducer constant of one-half that of primary Pockels cell 32. The secondary beam laser light output 33 of Pockels cell 46 is then directed to polarizer 48 which, like polarizer 34, is optically aligned ninety degrees with respect to polarizer 28. After passing through polarizer 48, secondary beam 33 is directed to a mirror 50 which redirects the secondary beam to the input of beam splitter 36 so that it may be recombined with first beam 31 and transmitted to detector 38 for measurement of the combined light intensity.

In the case of the present invention the ratio of output intensity to input intensity is as set forth in the following equation:

$$\frac{I}{I_o} = \left(\frac{1}{8}\sin^2\left(\frac{\pi}{2}\frac{S}{S_2,\lambda/2} + \frac{\pi}{4}\right) + \frac{1}{2}\sin^2\left(\frac{\pi}{2}\frac{S}{S_1,\lambda/2}\right)\right)$$

I = the intensity of the output of transducers.
$I_o$ = intensity of the combined input to transducers.
S = supplied stimulus (such as magnetic field, electric field, voltage or current).
$S_1,\lambda/2$ = the transducer constant of the first beam Pockels cell, based on the electro-optic or magneto-optic coefficients of said transducer and the geometry of the transducer.
$S_2,\lambda/2$ = the transducer constant of the secondary Pockels cell based on said secondary transducers, the electro-optic or magneto-optic coefficients and geometry of said secondary beam transducer,
$\pi/4$ = phase shift induced by one-quarter wave plate, which is an equivalent of $\theta$ in the previous equation.

Since in the present invention $\theta$ equals $\pi/4$ and and the transducer coefficient of the secondary beam Pockels cell 46 is one-half that of the primary beam Pockels cell 32, that is $S_2,\lambda/2 = \frac{1}{2} S_1,\lambda/2$, then aforesaid equation simplifies to the following:

$$\frac{I}{I_o} = \left(\frac{1}{8} \sin^2\left(\pi \frac{S}{S_1,\lambda/2} + \frac{\pi}{4}\right) + \frac{1}{2} \sin^2\left(\frac{\pi}{2} \frac{S}{S_1,\lambda/2}\right)\right)$$

This yields an effective range which for practical purposes can be considered linear from a value of 0 to 1.05 times $S_1,\lambda/2$. The graphic representation of the response curve of the present invention is as shown in FIG. 3 as curve 52.

This greatly enhanced linear range of operation enables a device constructed according to the present invention to be used without ancillary equipment for the direct measurement electrical or magnetic stimuli such as voltage, current, electric or magnetic fields. Because there is no need to use supplemental equipment, the inherent bandwidth, response time and accuracy characteristics of electro-optic and magneto-optic transducers are not degraded by limitations of ancillary equipment and the measuring devices can be constructed considerably less expensively.

It should be noted that the present invention can be practiced with many variations other than those as specifically set forth herein in the description of the preferred embodiment such as the use of optical fibers to direct the beam path of said secondary beam. Further, the polarizers, beam splitters and filters may be constructed in any workable size or material, provided that they transmit the laser beam. Similarly, any workable electro-optic or magneto-optic transducers may be capable of transmitting the laser beam may be substituted for the Pockels cells described in the preferred embodiment.

Obviously, numerous additional modifications of the present invention are possible in light of the above teachings. It is therefore to be understood that within the scope of the appended claims, the invention may be practiced otherwise then as specifically described herein.

What is claimed as new and desired to be secured by Letters Patent of the United States is:

1. An optical device for measuring voltages comprising:
   a laser light source;
   a first polarizer;
   a first beam splitter for dividing said polarized laser light into a first beam and a second beam, wherein said first beam passes sequentially through a first Pockels cell transducer having a voltage input and a first Pockels cell output polarizer optically oriented ninety degrees to said first polarizer, for receiving an output signal from said first pockels cell transducer, and wherein said second beam passes sequentially through a one-quarter wave phase shifting plate, an intensity reducing neutral density filter for attenuating intensity of said second beam to one-quarter thereof, a second Pockels cell transducer having a transducer constant one-half that of said first Pockels cell transducer and electrically connected to the same voltage input as said first Pockels cell transducer, a second Pockels cell output polarizer optically oriented ninety degrees to said first polarizer for receiving an output signal from said second pockels cell transducer;
   a second beam splitter for combining outputs from said first and second Pockels cell output polarizers; and
   a beam intensity detector optically aligned with said second beam splitter to detect intensity of the combined outputs from said first and second Pockels cell output polarizers.

2. An optical device as in claim 1 wherein said one-quarter wave phase shifting plate, said neutral density filter, said second Pockels cell transducer and said second Pockels cell output polarizer are optically aligned with respect to said second beam, said optical device further comprising means for directing said second beam from said first beam splitter to said one-quarter wave phase shifting plate and from said second Pockels cell output polarizer to said second beam splitter.

3. An optical device as in claim 2 wherein said means for directing comprises a plurality of beam directing mirrors.

* * * * *

UNITED STATES PATENT AND TRADEMARK OFFICE
CERTIFICATE OF CORRECTION

PATENT NO.   : 5,134,361
DATED        : July 28, 1992
INVENTOR(S)  : J. Keith Pillow It is certified that error appears in the above-indentified patent and that said Letters Patent is hereby corrected as shown below:

On title page, item [54], and col. 1, lines 1-2, should read

--OPTICAL SYSTEM FOR LINEARIZING NON-LINEAR ELECTRO-OPTIC EFFECTS--

Signed and Sealed this

Twenty-fourth Day of August, 1993

Attest:

BRUCE LEHMAN

*Attesting Officer*  *Commissioner of Patents and Trademarks*